(12) United States Patent
Zheng

(10) Patent No.: US 11,937,464 B2
(45) Date of Patent: Mar. 19, 2024

(54) ARRAY SUBSTRATE, MANUFACTURING METHOD THEREOF, AND DISPLAY PANEL

(71) Applicant: Wuhan China Star Optoelectronics Semiconductor Display Technology Co., Ltd., Hubei (CN)

(72) Inventor: Ying Zheng, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 870 days.

(21) Appl. No.: 16/971,304

(22) PCT Filed: Mar. 24, 2020

(86) PCT No.: PCT/CN2020/080929
§ 371 (c)(1),
(2) Date: Aug. 20, 2020

(87) PCT Pub. No.: WO2021/155630
PCT Pub. Date: Aug. 12, 2021

(65) Prior Publication Data
US 2023/0095458 A1    Mar. 30, 2023

(30) Foreign Application Priority Data

Feb. 7, 2020   (CN) .......................... 202010082513.7

(51) Int. Cl.
*H10K 59/124* (2023.01)
*H10K 59/12* (2023.01)
*H10K 71/00* (2023.01)

(52) U.S. Cl.
CPC .......... *H10K 59/124* (2023.02); *H10K 71/00* (2023.02); *H10K 59/1201* (2023.02)

(58) Field of Classification Search
CPC ... H10K 59/124; H10K 59/1201; H10K 71/00
USPC ........................................... 257/91
See application file for complete search history.

(56) References Cited

U.S. PATENT DOCUMENTS

| 2017/0214003 A1 | 7/2017 | Lee et al. | |
| 2018/0090698 A1* | 3/2018 | Jeong | H10K 59/131 |
| 2020/0006462 A1* | 1/2020 | Sung | H10K 50/844 |
| 2020/0035946 A1* | 1/2020 | Cheng | H10K 59/873 |

FOREIGN PATENT DOCUMENTS

| CN | 109860266 | 6/2019 |
| CN | 110085650 | 8/2019 |
| CN | 110211972 | 9/2019 |
| CN | 209356799 | 9/2019 |
| CN | 110491912 | 11/2019 |

(Continued)

*Primary Examiner* — Igwe U Anya

(57) ABSTRACT

An array substrate, a manufacturing method thereof, and a display panel are provided. The array substrate includes a base substrate, an array layer disposed on the base substrate, a light-emitting device layer disposed on the array layer, and an encapsulation layer covering the light-emitting device layer. The base substrate includes a first portion defined in a main display region and a second portion defined in a functional region, the second portion includes a first surface close to the array layer, and the first surface includes a first convex surface protruding in a direction toward to the array layer.

16 Claims, 8 Drawing Sheets

(56) References Cited

FOREIGN PATENT DOCUMENTS

| | | | |
|---|---|---|---|
| CN | 110610966 | 12/2019 | |
| CN | 110610970 | 12/2019 | |
| CN | 110649081 | 1/2020 | |
| CN | 110649081 A * | 1/2020 | ....... H01L 27/14627 |
| CN | 110828515 | 2/2020 | |

* cited by examiner

ARRAY SUBSTRATE, MANUFACTURING METHOD THEREOF, AND DISPLAY PANEL

RELATED APPLICATIONS

This application is a National Phase of PCT Patent Application No. PCT/CN2020/080929 having International filing date of Mar. 24, 2020, which claims the benefit of priority of Chinese Patent Application No. 202010082513.7 filed on Feb. 7, 2020. The contents of the above applications are all incorporated by reference as if fully set forth herein in their entirety.

FIELD AND BACKGROUND OF THE INVENTION

The present invention relates to the field of display technologies, and in particular, to an array substrate, a manufacturing method thereof, and a display panel.

Full screens, as brand-new display screens, bring people a new visual experience and sensory impact due to their extremely high screen ratio, and have become a goal pursued by display manufacturers. As shown in FIG. 1, in a full-screen, a photosensitive device 12 such as a camera is generally designed under the screen.

However, there are a plurality of layers of film layers 11 with poor transparency (such as a gate metal layer and a cathode layer) at regions corresponding to the photosensitive device 12 such as the camera on a display panel, resulting in a low luminous flux of light entering the photosensitive device 12 such as the camera, which affects image quality.

SUMMARY OF THE INVENTION

Technical Problem

The present invention provides an array substrate to solve a technical problem of the existence of a plurality of layers of poorly transparent film layers at regions corresponding to a photosensitive device such as a camera on a display panel, resulting in a low luminous flux of light entering the photosensitive device such as the camera.

Technical Solutions

In a first aspect, the present application provides an array substrate, including a main display region and a functional region, wherein the main display region is disposed around at least a part of the functional region, and the array substrate includes:
  a base substrate;
  an array layer disposed on the base substrate;
  a light-emitting device layer disposed on the array layer; and
  an encapsulation layer covering the light-emitting device layer;
  wherein the base substrate includes a first portion defined in the main display region and a second portion defined in the functional region, the second portion includes a first surface close to the array layer, and the first surface includes a first convex surface protruding in a direction toward to the array layer.

Furthermore, the second portion further includes a second surface opposite to the first substrate, and the second surface includes a second convex surface protruding in the direction toward to the array layer.

Furthermore, a thickness of the second portion is less than a thickness of the first portion.

Furthermore, the array layer includes a first split defined in the main display region and a second split defined in the functional region, and the second split is formed by a plurality of inorganic film layers.

Furthermore, a surface of each of the inorganic film layers away from the base substrate includes a convex surface protruding in a direction away from the base substrate.

Furthermore, the first split includes:
  an active layer disposed on the base substrate;
  a first insulation layer covering the active layer;
  a first metal layer disposed on the first insulation layer;
  a second insulation layer covering the first metal layer;
  a second metal layer disposed on the second insulation layer;
  an interlayer insulation layer covering the second metal layer; and
  a third metal layer disposed on the interlayer insulation layer;
  wherein the array substrate further includes a planarization layer disposed on the interlayer insulation layer and covering the third metal layer, and an anode layer and a pixel definition layer disposed on the planarization layer; and
  wherein a through hole penetrating the pixel definition layer and the planarization layer is defined in the functional region.

Furthermore, the second split includes:
  a first inorganic layer disposed on a same layer as the first insulation layer;
  a second inorganic layer disposed on a same layer as the second insulation layer; and
  a third inorganic layer disposed on a same layer as the interlayer insulation layer.

Furthermore, the light-emitting device layer is disposed in the main display region, and the encapsulation layer fills the through hole.

In a second aspect, the present application also provides a method of manufacturing an array substrate, including following steps:
  S10, forming a convex structure at a position corresponding to a functional region on a first surface of a carrier substrate;
  S20, forming a base substrate on the first surface of the carrier substrate;
  S30, forming an array layer on the base substrate;
  S40, forming a light-emitting device layer on the array layer;
  S50, forming an encapsulation layer covering the light-emitting device layer; and
  S60, separating the carrier substrate from the base substrate,
  wherein the base substrate includes a first portion defined in a main display region and a second portion defined in the functional region, the second portion includes a first surface close to the array layer, and the first surface includes a first convex surface protruding in a direction toward to the array layer.

Furthermore, the step S30 includes:
  S31, forming an active layer in the main display region of the base substrate;
  S32, forming a first insulation layer in the main display region and a first inorganic layer in the functional region on the base substrate, wherein the first insulation layer covers the active layer;

S33, forming a first metal layer on the first insulation layer;

S34, forming a second insulation layer on the first insulation layer and covering the first metal layer, and forming a second inorganic layer on the first inorganic layer;

S35, forming a second metal layer on the second insulation layer;

S36, forming an interlayer insulation layer on the second insulation layer and covering the second metal layer, and forming a third inorganic layer on the second inorganic layer;

S37, forming a third metal layer on the interlayer insulation layer;

S38, forming a planarization layer covering the third metal layer, and removing a portion of the planarization layer positioned in the functional region to form a first through hole penetrating the planarization layer; and S39, forming an anode layer and a pixel definition layer on the planarization layer, and removing a portion of the pixel definition layer positioned in the functional region to form a second through hole penetrating the pixel definition layer.

According to a third aspect, the present application further provides a display panel, the display panel including an array substrate having a main display region and a functional region, wherein the main display region is disposed around at least a part of the functional region, and the array substrate includes:

a base substrate;

an array layer disposed on the base substrate;

a light-emitting device layer disposed on the array layer; and an encapsulation layer covering the light-emitting device layer;

wherein the base substrate includes a first portion defined in the main display region and a second portion defined in the functional region, the second portion includes a first surface close to the array layer, and the first surface includes a first convex surface protruding in a direction toward to the array layer.

Furthermore, the second portion further includes a second surface opposite to the first substrate, and the second surface includes a second convex surface protruding in the direction toward to the array layer.

Furthermore, a thickness of the second portion is less than a thickness of the first portion.

Furthermore, the array layer includes a first split defined in the main display region and a second split defined in the functional region, and the second split is formed by a plurality of inorganic film layers.

Furthermore, a surface of each of the inorganic film layers away from the base substrate includes a convex surface protruding in a direction away from the base substrate.

Furthermore, the first split includes:

an active layer disposed on the base substrate;

a first insulation layer covering the active layer;

a first metal layer disposed on the first insulation layer;

a second insulation layer covering the first metal layer;

a second metal layer disposed on the second insulation layer;

an interlayer insulation layer covering the second metal layer; and a third metal layer disposed on the interlayer insulation layer;

wherein the array substrate further includes a planarization layer disposed on the interlayer insulation layer and covering the third metal layer, and an anode layer and a pixel definition layer disposed on the planarization layer; and wherein a through hole penetrating the pixel definition layer and the planarization layer is defined in the functional region.

Furthermore, the second split includes:

a first inorganic layer disposed on a same layer as the first insulation layer;

a second inorganic layer disposed on a same layer as the second insulation layer; and a third inorganic layer disposed on a same layer as the interlayer insulation layer.

Furthermore, the light-emitting device layer is disposed in the main display region, and the encapsulation layer fills the through hole.

Beneficial Effect

Only the inorganic film layers positioned on the functional region on the array layer are retained, thereby improving light transmittance at the functional region without drilling the inorganic film layers at the functional region, which can greatly reduce a process flow, and can also prevent toner generated by drilling from causing poor display in the main display region. In the meantime, the second portion of the base substrate and the inorganic film layers positioned in the functional region are set into a structure similar to a convex lens, so that light at the functional region is concentrated and luminous flux entering a photosensitive device such as a camera is improved.

REFERENCE LABELS 11, film layer; 12, photosensitive device;
20, main display region; 30, functional region;
40, base substrate; 41; first portion; 42, second portion; 421; first surface; 422, second surface;
50, array layer;
511, active layer; 512, first insulation layer; 513, first metal layer; 514, second insulation layer; 515, second metal layer; 516, interlayer insulation layer; 517, third metal layer; 518, planarization layer; 519, anode layer; 51a, pixel definition layer;
521, first inorganic layer; 522, second inorganic layer; 523, third inorganic layer; 53, water-oxygen barrier layer; 54, buffer layer;
60, light-emitting device layer; 61, light-emitting layer; 62, cathode layer;

70, encapsulation layer; 80, carrier substrate; 91, first through hole; and 92, second through hole.

DESCRIPTION OF SPECIFIC EMBODIMENTS OF THE INVENTION

In order to illustrate the technical solutions of the present disclosure or the related art in a clearer manner, the drawings desired for the present disclosure or the related art will be described hereinafter briefly. It should be understood that the specific embodiments described herein are only used to explain the application; and are not used to limit the application.

Figure 1:
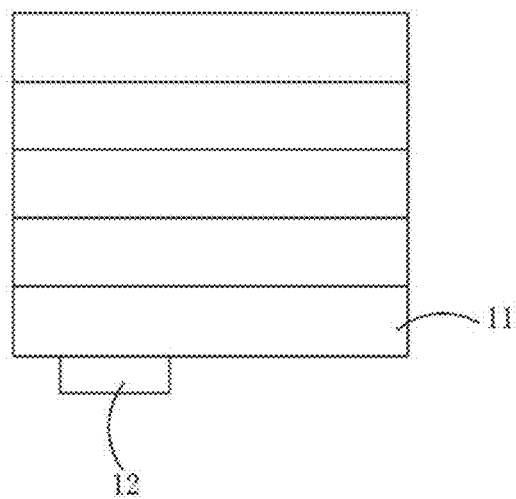
FIG. 1 is a schematic structural diagram of an array substrate in a background art of the present invention.
Figure 2:
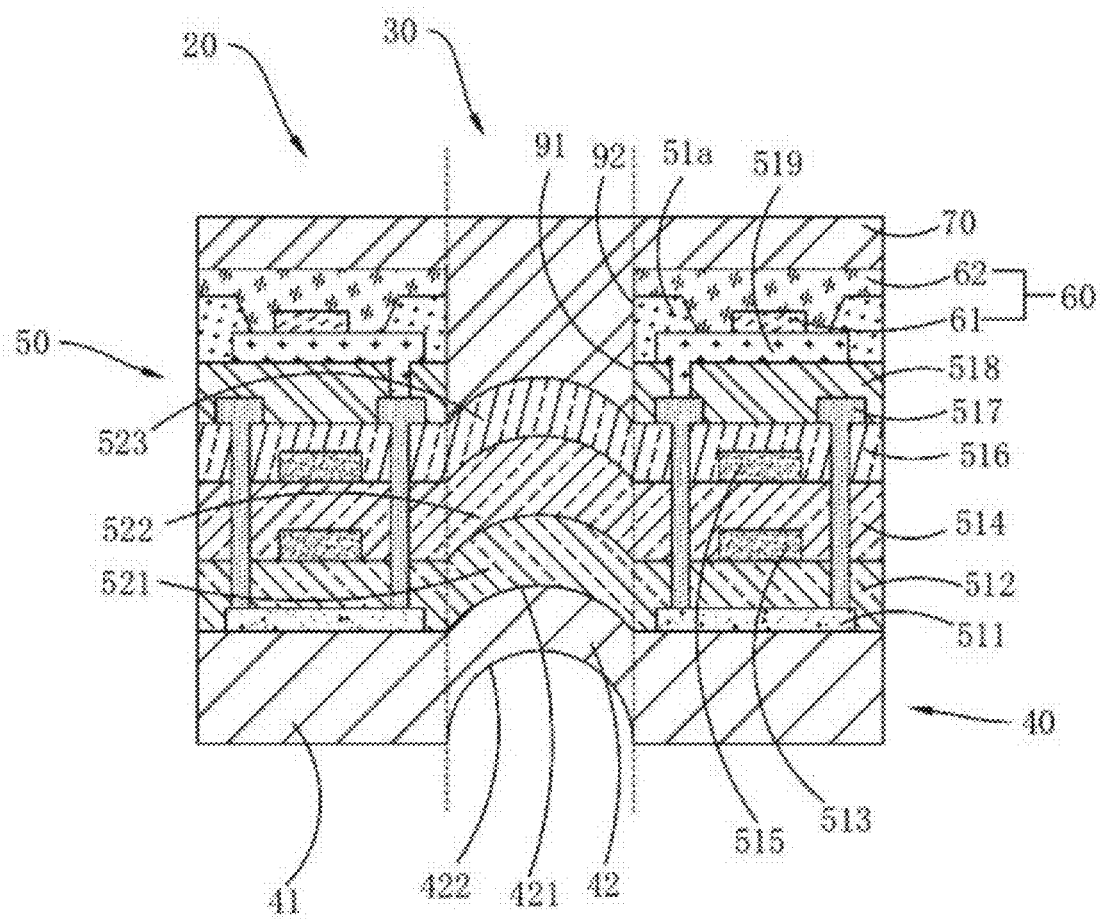
FIG. 2 is a schematic structural diagram of an array substrate according to an embodiment of the present invention.

An array substrate is shown in FIG. 2, wherein the array substrate includes a main display region 20 and a functional region 30. The main display region 20 is disposed around at least a part of the functional region 30. It should be noted that a region limited by dashed line in FIG. 2 is the functional region 30.

Specifically, the array substrate includes a base substrate 40, an array layer 50 disposed on the base substrate 40, a light-emitting device layer 60 disposed on the array layer 50, and an encapsulation layer 70 covering the light-emitting device layer 60.

Specifically, the base substrate 40 is a transparent substrate. The base substrate 40 includes a first portion 41 defined in the main display region 20 and a second portion 42 defined in the functional region 30. The second portion 42 includes a first surface 421 close to the array layer 50, and the first surface 421 includes a first convex surface protruding in a direction toward to the array layer 50.

It should be noted that, for those skilled in the art, convex lens has a light-concentrating effect, and by setting the first surface 421 of the second portion 42 of the functional region 30 to be convex toward the array layer 50 to form a structure similar to a convex lens, light incident on the functional region is concentrated, luminous flux entering a photosensitive device such as a camera is increased, and image quality is improved.

Furthermore, the second portion 42 further includes a second surface 422 opposite to the first substrate 421, and the second surface 422 includes a second convex surface protruding in the direction toward to the array layer 50. Thereby, light-concentrating ability of the second portion 42 is further improved.

It should be noted that both the first convex surface and the second convex surface can be uniform spherical surfaces.

Furthermore, a thickness of the second portion 42 is less than a thickness of the first portion 41.

It should be noted that although the base substrate 40 is a transparent substrate, a thickness of the base substrate 40 also greatly affects light transmittance. By reducing a vertical thickness of the second portion 42, light transmittance of the second portion 42 is increased, and imaging quality of the photosensitive device such as the camera is improved.

Specifically, the array layer 50 includes a first split defined in the main display region 20 and a second split defined in the functional region 30. The second split is formed of a plurality of inorganic film layers.

It should be noted that preparation material of the inorganic film layers can be one or more of silicon nitride and silicon oxide. As known to those skilled in the art, light transmittance of the inorganic film layers is higher compared with organic film layers and metal film layers. Only the inorganic film layers positioned on the functional region 30 are retained, thereby improving light transmittance at the functional region 30. In the meantime, drilling the inorganic film layers at the functional region 30 is not necessary, which can greatly reduce a process flow, and can also prevent toner generated by drilling from causing poor display in the main display region 20.

Furthermore, a surface of each of the inorganic film layers away from the base substrate 40 includes a convex surface protruding in the direction away from the base substrate 40.

The inorganic film layers disposed on the functional region 30 are retained, and the process flow is reduced. In the meantime, all the inorganic film layers disposed on the functional region 30 are made into a structure similar to a convex lens, thereby further improving light-concentrating ability of the functional region 30 to ensure luminous flux entering the photosensitive device such as the camera.

Specifically, the first split includes an active layer 511 disposed on the base substrate 40, a first insulation layer 512 covering the active layer 511, a first metal layer 513 disposed on the first insulation layer 512, a second insulation layer 514 covering the first metal layer 513, a second metal layer 515 disposed on the second insulation layer 514, an interlayer insulation layer 516 covering the second metal layer 515, and a third metal layer 517 disposed on the interlayer insulation layer 516.

The array substrate further includes a planarization layer 518 disposed on the interlayer insulation layer 516 and covering the third metal layer 517, and an anode layer 519 and a pixel definition layer 51a disposed on the planarization layer 518.

The functional region 30 is defined with a through hole penetrating the pixel definition layer 51a and the planarization layer 518.

It should be noted that the planarization layer 518 and the pixel definition layer 51a are both organic layers, and light transmittance of the organic layer is lower. By defining the through hole penetrating the pixel definition layer 51a and the planarization layer 518 in the functional region 30, light transmittance at the functional region 30 is improved.

It should be noted that the light-emitting device layer 60 is not required to be disposed at the functional region 30, and therefore the pixel definition layer 51a is not required. The planarization layer 518 is configured to form a uniform pixel definition layer 51a, and in the case where no pixel is required to be disposed at the functional region 30, it is also not necessary to dispose the planarization layer 518 at the functional region 30. Therefore, removing a part of the pixel definition layer 51a and the planarization layer 518 positioned on the functional region 30 to form the through hole can improve light transmittance of the functional region 30, and will not affect normal display of a display panel.

Specifically, the second split includes a first inorganic layer 521 disposed on a same layer as the first insulation layer 512, a second inorganic layer 522 disposed on a same layer as the second insulation layer 514, and a third inorganic layer 523 disposed on a same layer as the interlayer insulation layer 516.

It should be noted that the first inorganic layer 521 can be formed using a same material and a same process as the first insulation layer 512. The second inorganic layer 522 can be formed using a same material and a same process as the second insulation layer 514. The third inorganic layer 523 can be formed using a same material and a same process as the interlayer insulation layer 516.

Specifically, the light-emitting device layer 60 is disposed in the main display region 20, and the encapsulation layer 70 covers the light-emitting device layer 60 and fills the through hole. The light-emitting device layer 60 includes a light-emitting layer 61 disposed on the anode layer 519 and a cathode layer 62 disposed on the light-emitting layer 61.

After the cathode layer 62 is formed, a part of the cathode layer 62 positioned in the functional region 30 is removed, so that the functional region 30 does not have metal layers such as the anode layer 519 and the cathode layer 62, thereby improving light transmittance of the functional region 30.

Figure 3:
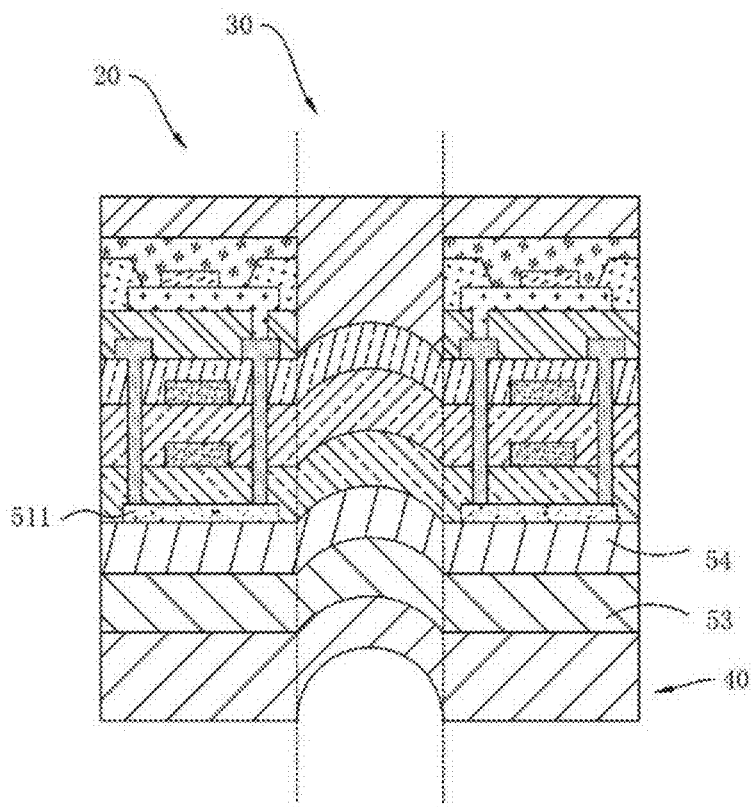
FIG. 3 is a schematic structural diagram of an array substrate according to another embodiment of the present invention.

In an embodiment, as shown in FIG. 3, the array layer 50 further includes a water-oxygen barrier layer 53 and a buffer layer 54 which are stacked on the base substrate 40, and the water-oxygen barrier layer 53 and the buffer layer 54 are made of an inorganic material. The active layer 511, the first insulation layer 512, and the first inorganic layer 521 are all disposed on the buffer layer 54.

It should be noted that upper and lower surfaces of the portion of the water-oxygen barrier layer 53 and the buffer layer 54 positioned in the functional region 30 are protruded upward to form a structure similar to a convex lens.

It should be noted that materials for preparing the water-oxygen barrier layer 53 and the buffer layer 54 can be one or more of silicon nitride and silicon oxide.

Figure 4:
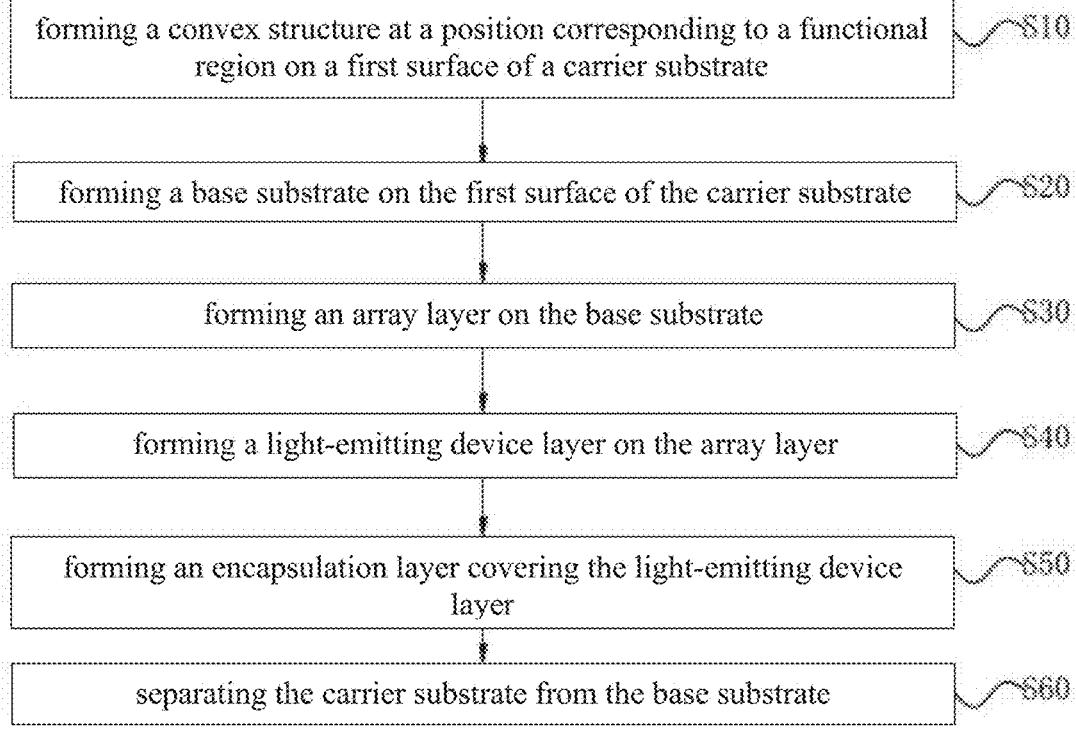
FIG. 4 is a schematic flowchart of manufacturing steps of the array substrate according to an embodiment of the present invention.

Based on the above-mentioned display panel, the present invention also provides a method of manufacturing a display panel for preparing the display panel as described in any of the above embodiments. As shown in FIG. 4, the method of manufacturing the display panel includes following steps:

S10, forming a convex structure at a position corresponding to a functional region 30 on a first surface of a carrier substrate 80;

S20, forming a base substrate 40 on the first surface of the carrier substrate 80;

S30, forming an array layer 50 on the base substrate 40;

S40, forming a light-emitting device layer 60 on the array layer 50;

S50, forming an encapsulation layer 70 covering the light-emitting device layer 60; and S60, separating the carrier substrate 80 from the base substrate 40;

wherein the base substrate 40 includes a first portion 41 defined in a main display region 20 and a second portion 42 defined in the functional region 30, the second portion 42 includes a first surface 421 close to the array layer 50, and the first surface 421 includes a first convex surface protruding in a direction toward to the array layer 50.

The step S30 includes

S31, forming an active layer 511 in the main display region 20 of the base substrate 40;

S32, forming a first insulation layer 512 in the main display region 20 and a first inorganic layer 521 in the functional region 30 on the base substrate 40, the first insulation layer 512 covering the active layer 511;

S33, forming a first metal layer 513 on the first insulation layer 512;

S34, forming a second insulation layer 514 on the first insulation layer 512 and covering the first metal layer 513, and forming a second inorganic layer 522 on the first inorganic layer 521;

S35, forming a second metal layer 515 on the second insulation layer 514;

S36, forming an interlayer insulation layer 513 on the second insulation layer 514 and covering the second metal layer 515, and forming a third inorganic layer 523 on the second inorganic layer 522;

S37, forming a third metal layer 517 on the interlayer insulation layer 516;

S38, forming a planarization layer 518 covering the third metal layer 517, and removing a portion of the planarization layer 518 positioned in the functional region 30 to form a first through hole 91 penetrating the planarization layer 518; and S39, forming an anode layer 519 and a pixel definition layer 51a on the planarization layer 518, and removing a portion of the pixel definition layer 51a positioned in the functional region 30 to form a second through hole 92 penetrating the pixel definition layer 51a.

Referring to FIG. 5 to FIG. 14, FIG. 5 to FIG. 14 are schematic flowcharts of a manufacturing process of an array substrate according to an embodiment.

Figure 5:
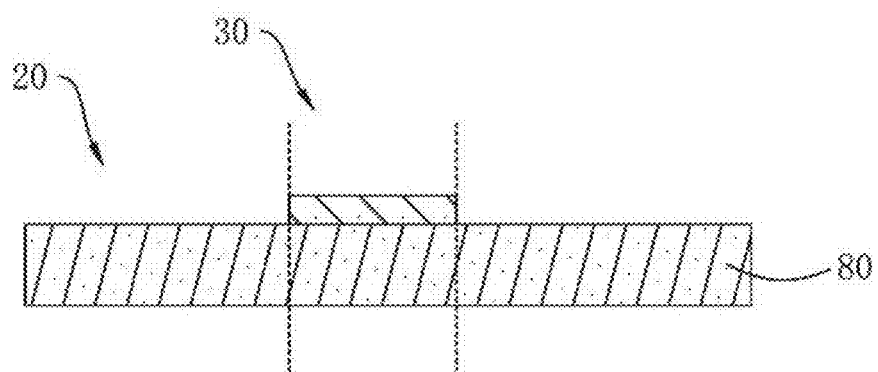
FIGS. 5, 6, 7, 8, 9, 10, 11, 12, 13 and 14 are schematic flowcharts of a manufacturing process of an array substrate according to an embodiment.

As shown in FIG. 5, a carrier substrate 80 is provided, and a layer of negative photoresist is formed on the carrier substrate 80. The negative photoresist positioned on the functional region 30 is exposed by using a mask, and the negative photoresist positioned on the other position is removed by using a developing solution.

Figure 6:
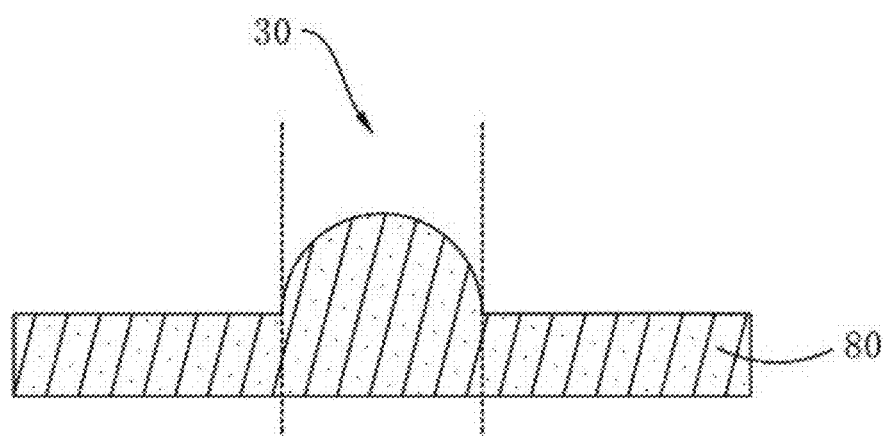

As shown in FIG. 6, a portion of the carrier substrate 80 that is not protected by the negative photoresist is etched by an etchant, thereby forming a convex structure protruding from a first surface of the carrier substrate 80 at a position corresponding to the functional region 30. It should be noted that a thickness of the carrier substrate 80 etched by the etchant ranges from 6 um (micrometer) to 8 um.

Figure 7:
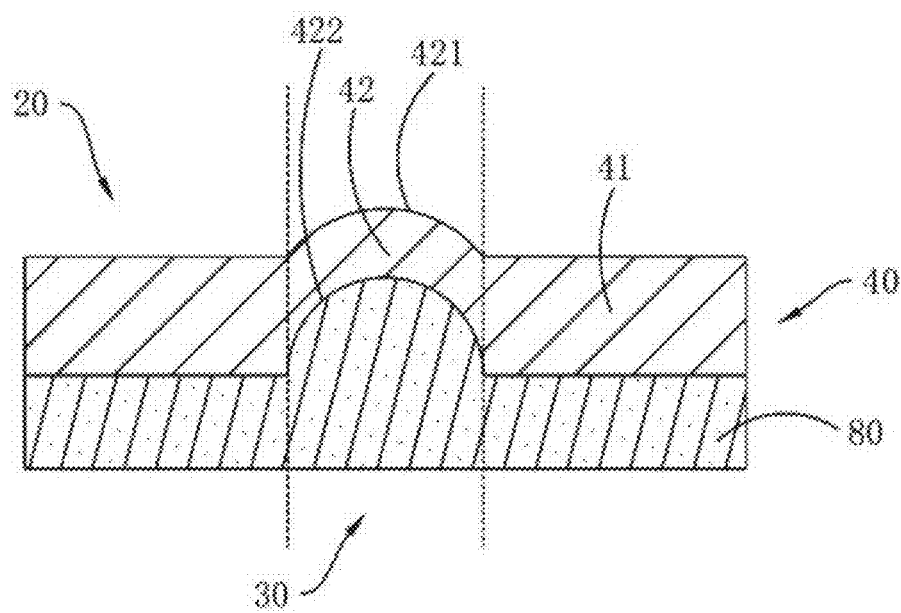

As shown in FIG. 7, a polyimide material is coated on the carrier substrate 80 to form the base substrate 40. Since the polyimide material has a relatively higher viscosity, the polyimide material cannot be completely leveled. The polyimide material is formed with a first portion 41 in the main display region 20 on the carrier substrate 80, and a second portion 42 on the convex structure positioned in the functional region 30. The first surface 421 and the second surface 422 of the second portion 42 are protruded upward to form a structure similar to a convex lens.

It should be noted that the base substrate 40 may have a single-layer structure or a multilayer structure, such as a first polyimide layer, an isolation layer, and a second polyimide layer which are sequentially laminated.

Figure 8:
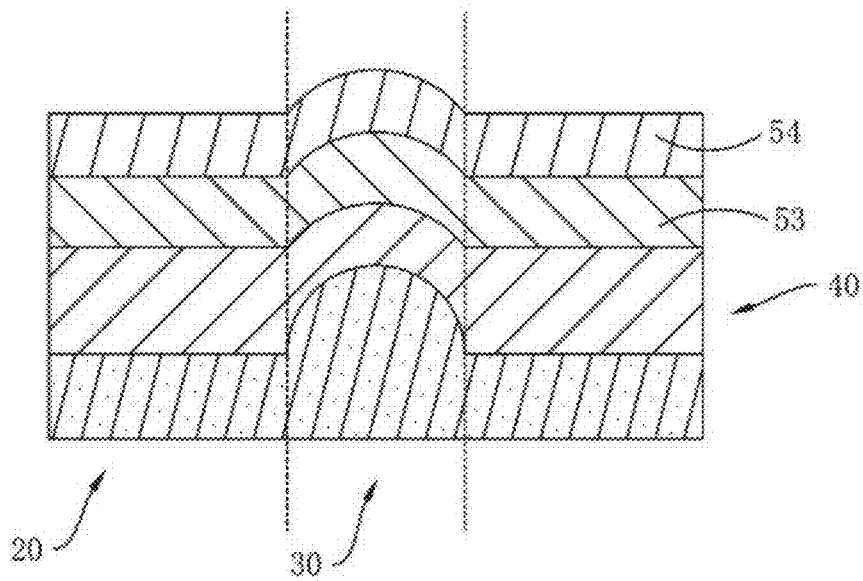

As shown in FIG. 8, a water-oxygen barrier layer 53 and a buffer layer 54 are formed by using an inorganic material on the base substrate 40 in sequence.

It should be noted that, because of the structure similar to a convex lens on the base substrate 40, upper and lower surfaces of a portion where the water-oxygen barrier layer 53 and the buffer layer 54 are positioned in the functional region 30 also protrude upward to form a structure similar to a convex lens.

Figure 9:
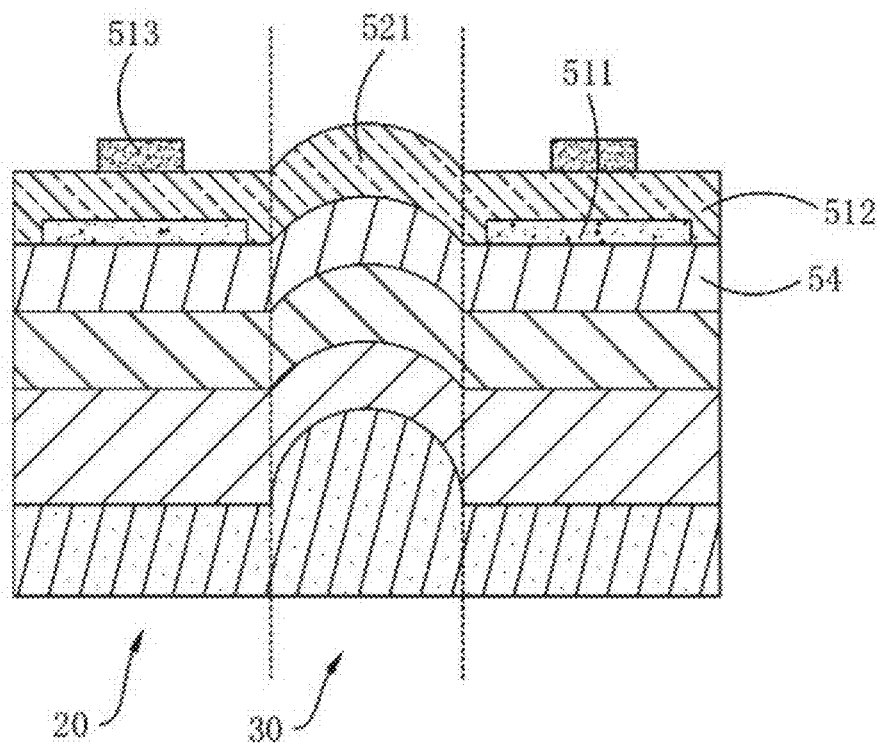

As shown in FIG. 9, a semiconductor layer is formed on the buffer layer 54 by using a semiconductor material, and the semiconductor layer is patterned to remove a portion of the semiconductor layer positioned in the functional region 30 to form an active layer 511 positioned in the main display region 20.

A first insulation layer 512 positioned in the main display region 20 and a first inorganic layer 521 positioned in the functional region 30 are formed on the buffer layer 54, and the first insulation layer 512 covers the active layer 511. Upper and lower surfaces of the first inorganic layer 521 are protruded upward to form a structure similar to a convex lens.

A first metal conductive layer is formed on the first insulation layer 512 and the first inorganic layer 521 by using a metal material. The first metal conductive layer is patterned, and a portion of the first metal conductive layer positioned on the inorganic layer 521 is etched away to from a first metal layer 513 positioned in the main display region 20. It should be noted that the first metal layer 513 is a first gate metal layer.

Figure 10:
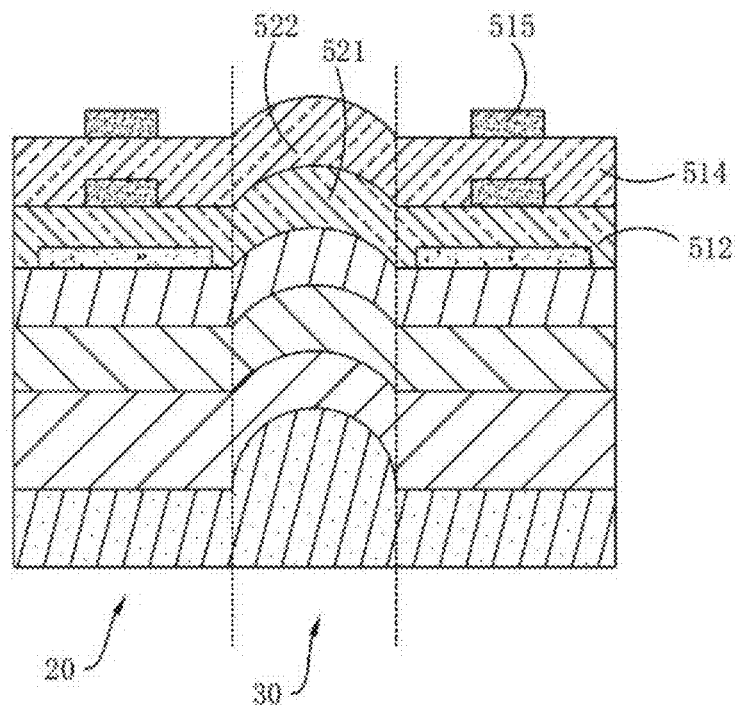

As shown in FIG. 10, a second insulation layer 514 is formed on the first insulation layer 512 and covers the first metal layer 513, and a second inorganic layer 522 is formed on the first inorganic layer 521. Upper and lower surfaces of the second inorganic layer 522 are protruded upward to form a structure similar to a convex lens.

The second metal layer 515 is formed on the second insulation layer 514 by a same method as the first metal layer 513. It should be noted that the second metal layer 515 is a second gate metal layer.

Figure 11:
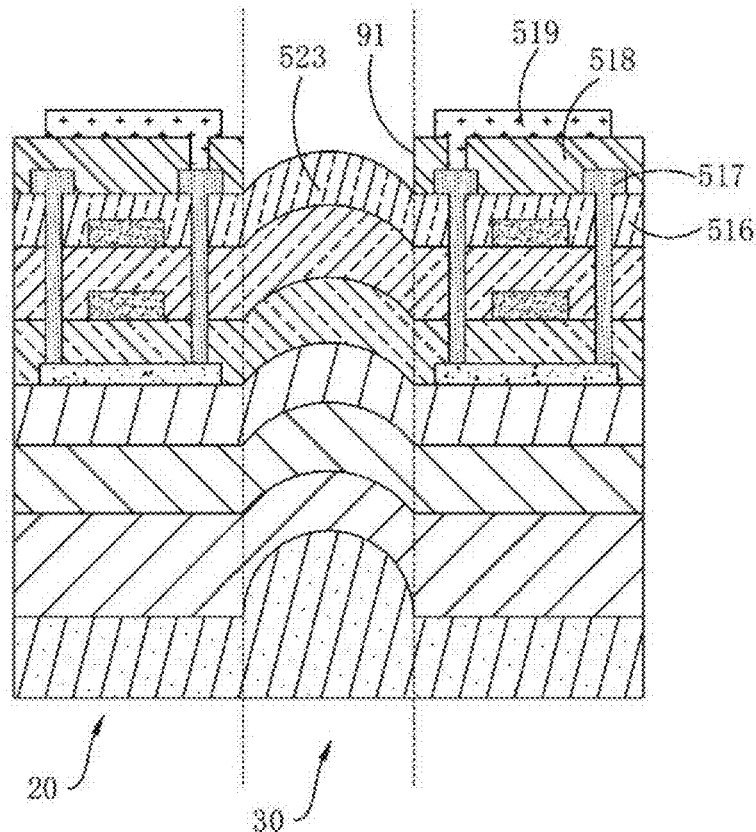

As shown in FIG. 11, an interlayer insulation layer 516 is formed on the second insulation layer 514 and covers the second metal layer 515, and a third inorganic layer 523 is formed on the second inorganic layer 522. Upper and lower surfaces of the third inorganic layer 523 are protruded upward to form a structure similar to a convex lens.

A third metal conductive layer is formed on the interlayer insulation layer 516 and the third inorganic layer 523 by using a second conductive metal material. The third metal conductive layer is patterned, and a portion of the third metal conductive layer positioned on the third inorganic layer 523 is etched away to form a third metal layer 517 on the interlayer insulation layer 516. It should be noted that the third metal layer 517 is a source-drain metal layer, including sources-drains, data traces, and a high-potential source line (VDD).

An organic material is used to form a planarization layer 518 covering the third metal layer 517, and a portion of the planarization layer 518 positioned in the functional region 30 is removed to form a first through hole 91 penetrating the planarization layer 518. Then, an anode layer 519 is formed on the planarization layer 518 in the main display region 20.

It should be noted that, when the first through hole 91 is formed, a via hole extending to a surface of the third metal layer 517 is also formed on the planarization layer 518, and the anode layer 519 is in contact with the third metal layer 517 through the via hole.

Figure 12:
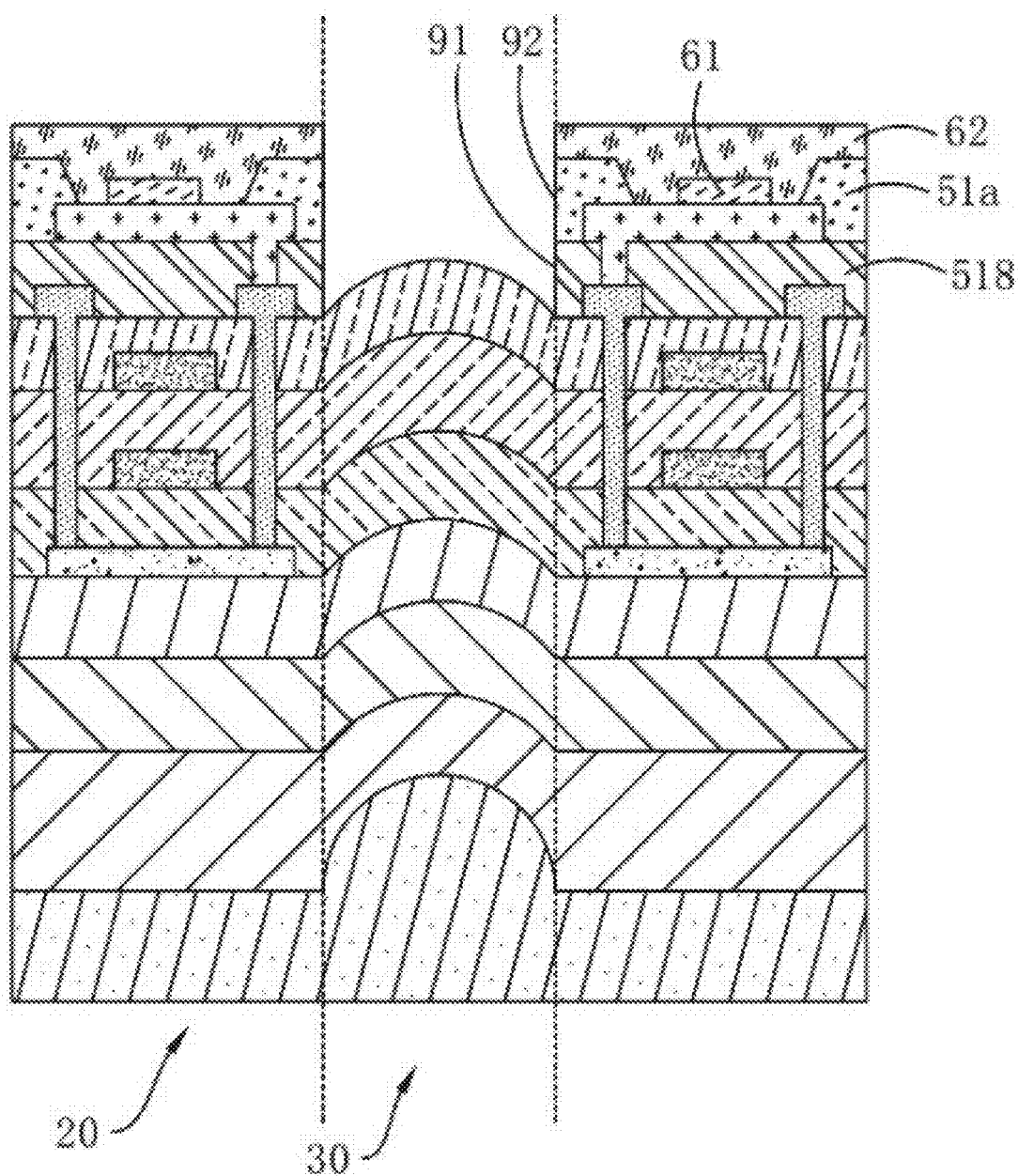

As shown in FIG. 12, a pixel definition layer 51a is formed on the planarization layer 518 by using an organic material, and a portion of the pixel definition layer 51a positioned in the functional region 30 is removed to form a second through hole 92 penetrating the pixel definition layer 51a. The second through hole 92 is connected to the first through hole 91 to form a through hole penetrating the planarization layer 518 and the pixel definition layer 51a.

A cathode layer 62 covering the anode layer 519 is formed, and a portion of the cathode layer 62 positioned in the functional region 30 is removed, so as to prevent the cathode layer 62 from reducing light transmittance of the functional region 30.

Figure 13:
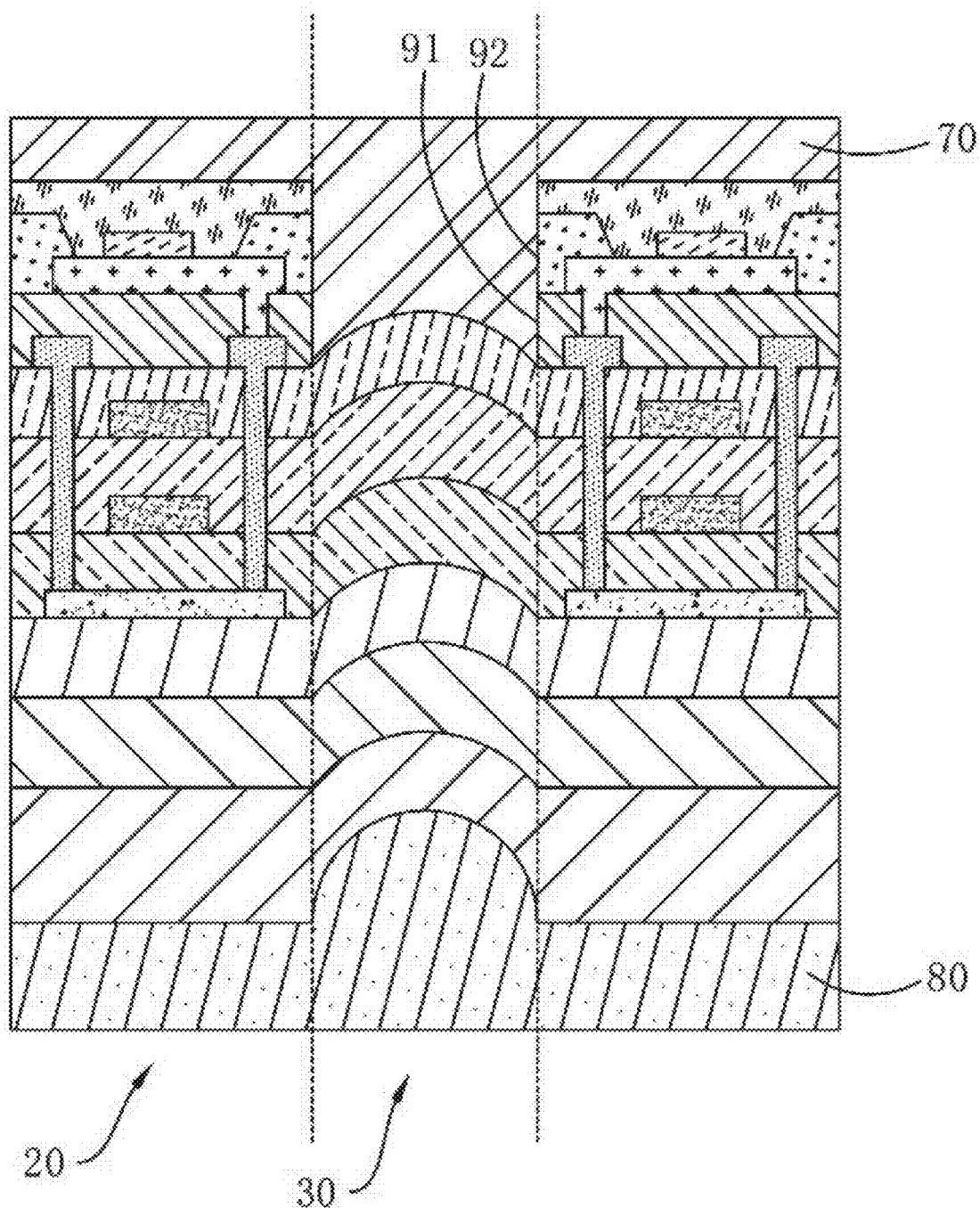

As shown in FIG. 13, an encapsulation layer 70 is formed to cover the cathode layer 62 and filled in the first through hole 91 and the second through hole 92. The encapsulation layer 70 has high light transmittance and water-oxygen barrier ability, thereby ensuring light transmittance of the functional region 30 as well as preventing water-oxygen intrusion into an organic light-emitting diode (OLED) device.

Figure 14:
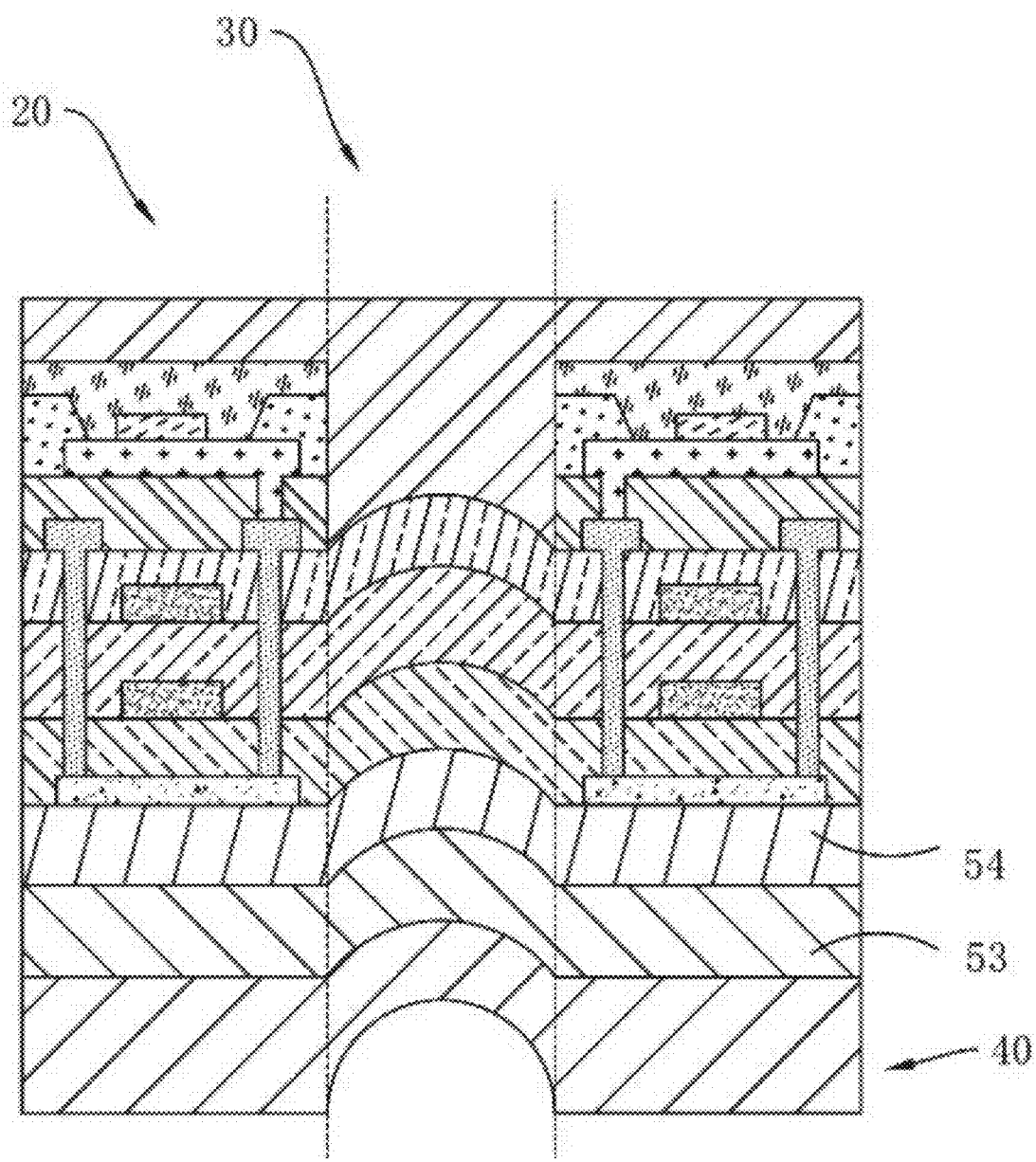

As shown in FIG. 14, the carrier substrate 80 is separated from the base substrate 40 so that a bottom surface of the base substrate 40 is exposed.

Based on the above-mentioned array substrate, the present invention further provides a display panel, which includes the array substrate described in any one of the above embodiments.

The beneficial effect of the present invention is that only the inorganic film layers positioned on the functional region 30 of the array layer 50 are retained, thereby improving light transmittance at the functional region 30. Furthermore, drilling the inorganic film layers at the functional region 30 is not necessary, which can greatly reduce a process flow, and can also prevent toner generated by drilling from causing poor display in the main display region 20. In the meantime, the second portion 42 of the base substrate 40 and the inorganic film layers positioned in the functional region 30 can be set to a structure similar to a convex lens, so that light incident on the functional region 30 is concentrated, and luminous flux entering a photosensitive device such as a camera is increased.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, comprising a main display region and a functional region, wherein the main display region is disposed around at least a part of the functional region, and the array substrate comprises:
   a base substrate;
   an array layer disposed on the base substrate;
   a light-emitting device layer disposed on the array layer; and
   an encapsulation layer covering the light-emitting device layer;
   wherein the base substrate comprises a first portion defined in the main display region and a second portion defined in the functional region, the second portion comprises a first surface close to the array layer, and the first surface comprises a first convex surface protruding in a direction toward to the array layer,
   wherein a thickness of the second portion is less than a thickness of the first portion.

2. The array substrate according to claim 1, wherein the second portion further comprises a second surface opposite to the first surface, and the second surface comprises a second convex surface protruding in the direction toward to the array layer.

3. The array substrate according to claim 1, wherein the array layer comprises a first split defined in the main display region and a second split defined in the functional region, and the second split is formed by a plurality of inorganic film layers.

4. The array substrate according to claim 3, wherein a surface of each of the inorganic film layers away from the base substrate comprises a convex surface protruding in a direction away from the base substrate.

5. The array substrate according to claim 3, wherein the first split comprises:
   an active layer disposed on the base substrate;
   a first insulation layer covering the active layer;
   a first metal layer disposed on the first insulation layer;
   a second insulation layer covering the first metal layer;

a second metal layer disposed on the second insulation layer;
an interlayer insulation layer covering the second metal layer; and
a third metal layer disposed on the interlayer insulation layer;
wherein the array substrate further comprises a planarization layer disposed on the interlayer insulation layer and covering the third metal layer, and an anode layer and a pixel definition layer disposed on the planarization layer; and
wherein a through hole penetrating the pixel definition layer and the planarization layer is defined in the functional region.

6. The array substrate according to claim 5, wherein the second split comprises:
a first inorganic layer disposed on a same layer as the first insulation layer;
a second inorganic layer disposed on a same layer as the second insulation layer; and
a third inorganic layer disposed on a same layer as the interlayer insulation layer.

7. The array substrate according to claim 6, wherein the light-emitting device layer is disposed in the main display region, and the encapsulation layer fills the through hole.

8. A method of manufacturing an array substrate, comprising following steps:
S10, forming a convex structure at a position corresponding to a functional region on a first surface of a carrier substrate;
S20, forming a base substrate on the first surface of the carrier substrate;
S30, forming an array layer on the base substrate;
S40, forming a light-emitting device layer on the array layer;
S50, forming an encapsulation layer covering the light-emitting device layer; and
S60, separating the carrier substrate from the base substrate,
wherein the base substrate comprises a first portion defined in a main display region and a second portion defined in the functional region, the second portion comprises a first surface close to the array layer, and the first surface comprises a first convex surface protruding in a direction toward to the array layer,
wherein a thickness of the second portion is less than a thickness of the first portion.

9. The method of manufacturing the array substrate according to claim 8, wherein the step S30 comprises:
S31, forming an active layer in the main display region of the base substrate;
S32, forming a first insulation layer in the main display region and a first inorganic layer in the functional region on the base substrate, wherein the first insulation layer covers the active layer;
S33, forming a first metal layer on the first insulation layer;
S34, forming a second insulation layer on the first insulation layer and covering the first metal layer, and forming a second inorganic layer on the first inorganic layer;
S35, forming a second metal layer on the second insulation layer;
S36, forming an interlayer insulation layer on the second insulation layer and covering the second metal layer, and forming a third inorganic layer on the second inorganic layer;
S37, forming a third metal layer on the interlayer insulation layer;
S38, forming a planarization layer covering the third metal layer, and removing a portion of the planarization layer positioned in the functional region to form a first through hole penetrating the planarization layer; and
S39, forming an anode layer and a pixel definition layer on the planarization layer, and removing a portion of the pixel definition layer positioned in the functional region to form a second through hole penetrating the pixel definition layer.

10. A display panel, comprising an array substrate having a main display region and a functional region, wherein the main display region is disposed around at least a part of the functional region, and the array substrate comprises:
a base substrate;
an array layer disposed on the base substrate;
a light-emitting device layer disposed on the array layer; and
an encapsulation layer covering the light-emitting device layer;
wherein the base substrate comprises a first portion defined in the main display region and a second portion defined in the functional region, the second portion comprises a first surface close to the array layer, and the first surface comprises a first convex surface protruding in a direction toward to the array layer,
wherein a thickness of the second portion is less than a thickness of the first portion.

11. The display panel according to claim 10, wherein the second portion further comprises a second surface opposite to the first surface, and the second surface comprises a second convex surface protruding in the direction toward to the array layer.

12. The display panel according to claim 10, wherein the array layer comprises a first split defined in the main display region and a second split defined in the functional region, and the second split is formed by a plurality of inorganic film layers.

13. The display panel according to claim 12, wherein a surface of each of the inorganic film layers away from the base substrate comprises a convex surface protruding in a direction away from the base substrate.

14. The display panel according to claim 12, wherein the first split comprises:
an active layer disposed on the base substrate;
a first insulation layer covering the active layer;
a first metal layer disposed on the first insulation layer;
a second insulation layer covering the first metal layer;
a second metal layer disposed on the second insulation layer;
an interlayer insulation layer covering the second metal layer; and
a third metal layer disposed on the interlayer insulation layer;
wherein the array substrate further comprises a planarization layer disposed on the interlayer insulation layer and covering the third metal layer, and an anode layer and a pixel definition layer disposed on the planarization layer; and
wherein a through hole penetrating the pixel definition layer and the planarization layer is defined in the functional region.

15. The display panel according to claim 14, wherein the second split comprises:
a first inorganic layer disposed on a same layer as the first insulation layer;

a second inorganic layer disposed on a same layer as the second insulation layer; and a third inorganic layer disposed on a same layer as the interlayer insulation layer.

16. The display panel according to claim 15, wherein the light-emitting device layer is disposed in the main display region, and the encapsulation layer fills the through hole.

\* \* \* \* \*